United States Patent
Takayama et al.

(10) Patent No.: US 7,613,220 B2
(45) Date of Patent: Nov. 3, 2009

(54) TWO-WAVELENGTH SEMICONDUCTOR LASER DEVICE AND METHOD FOR FABRICATING THE SAME

(75) Inventors: Toru Takayama, Nara (JP); Tomoya Satoh, Osaka (JP); Isao Kidoguchi, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/866,724

(22) Filed: Oct. 3, 2007

(65) Prior Publication Data

US 2008/0080580 A1    Apr. 3, 2008

(30) Foreign Application Priority Data

Oct. 3, 2006    (JP) .............................. 2006-272125

(51) Int. Cl.
*H01S 5/00*    (2006.01)
(52) U.S. Cl. ............ 372/50.121; 372/50.1; 372/46.015; 372/46.01
(58) Field of Classification Search ............ 372/45.016, 372/45.015, 45.011, 45.01, 46.01, 50.121, 372/50.1
See application file for complete search history.

(56) References Cited

U.S. PATENT DOCUMENTS 5,018,158 A * 5/1991 Okada et al. ........... 372/46.016

2005/0018733 A1    1/2005 Wada et al.

FOREIGN PATENT DOCUMENTS

| JP | 11-186651 | 7/1999 |
| JP | 2003-31901 | 1/2003 |
| JP | 2005-44993 | 2/2005 |
| JP | 2006-261446 | 9/2006 |

* cited by examiner

*Primary Examiner*—Minsun Harvey
*Assistant Examiner*—Kinam Park
(74) *Attorney, Agent, or Firm*—Hamre, Schumann, Mueller & Larson, P.C.

(57) ABSTRACT

A first and second semiconductor laser, which comprise buffer layers, cladding layers, quantum well active layers, and cladding layers integrated on the substrate and have a stripe geometry, are integrated on a common substrate, with the quantum well active layers in the vicinity of the cavity facets disordered by impurity diffusion. Relationships $\lambda 1 > \lambda b1$, $\lambda 2 > \lambda b2$, $\lambda 1 > \lambda 2$, and $E1 \leqq E2$ are satisfied, where $\lambda 1$ and $\lambda 2$ are defined, respectively, as the emission wavelengths of the active layers of the first and second semiconductor lasers, $E1$ and $E2$, respectively, as the forbidden band energies of the buffer layers of the first and second semiconductor lasers, and $\lambda b1$ and $\lambda b2$ respectively as the wavelengths corresponding to the forbidden band energies of the buffer layers of the first and second semiconductor lasers. The generation of reactive currents flowing through the window portions, which is caused by the intensification of disordering performed for window region formation, can be appropriately suppressed for both types of integrated semiconductor lasers.

2 Claims, 8 Drawing Sheets

TWO-WAVELENGTH SEMICONDUCTOR LASER DEVICE AND METHOD FOR FABRICATING THE SAME

BACKGROUND OF THE INVENTION

1. Field of the Invention

The present invention relates to red and infrared semiconductor laser devices employed as light sources for the pickup units of optical disc devices and as light sources necessary for other electronic devices, information processing devices, etc.

2. Description of Related Art

DVD devices, in which recording and reproduction is carried out using high-capacity digital video discs (DVDs) capable of high density recording, utilize AlGaInP semiconductor lasers with an emission wavelength of 650 nm as laser light sources for recording and reading. For this reason, it has been impossible for the optical pickup units of conventional DVD devices to reproduce compact discs (CD) and minidiscs (MD) reproduced using AlGaAs semiconductor lasers with an emission wavelength of 780 nm.

Consequently, to solve this problem, optical pickup units have been adopted that have laser chips incorporated into separate packages and comprise an AlGaInP semiconductor laser with an emission wavelength of 650 nm and an AlGaAs semiconductor laser with an emission wavelength of 780 nm. However, the problem with such optical pickup units is their increased size due to the installation of the two packages including the AlGaInP semiconductor laser and AlGaAs semiconductor laser, and as a result, the increased size of the DVD devices. Accordingly, in order to solve this problem, JP H11-186651A discloses an integrated semiconductor light-emitting device, which has light-emitting element structures formed of semiconductor layers grown on a common substrate and includes various kinds of semiconductor light-emitting elements with different emission wavelengths.

Figure 7:
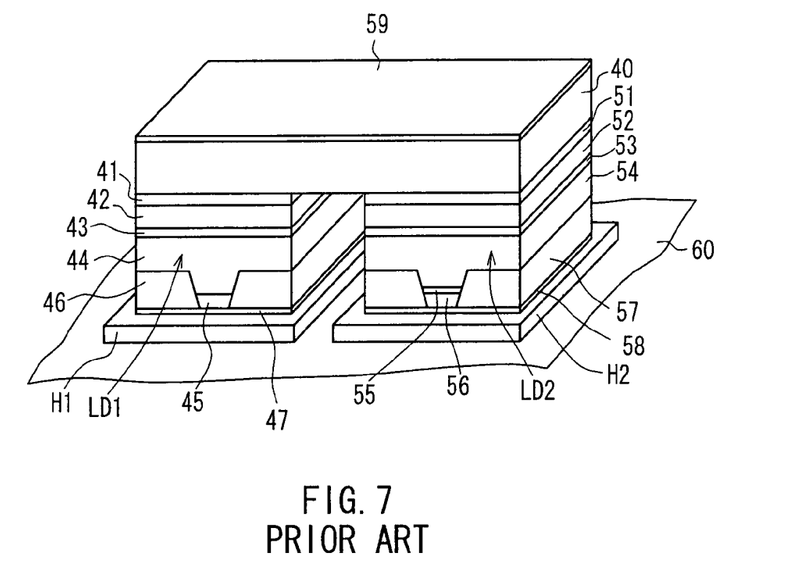
FIG. 7 is a perspective view of a conventional integrated semiconductor light-emitting device.

An exemplary conventional integrated semiconductor light-emitting device is illustrated in FIG. 7. In this integrated semiconductor laser device, an AlGaAs semiconductor laser LD1 with an emission wavelength in the 700-nm band (e.g. 780 nm) and an AlGaInP semiconductor laser LD2 with an emission wavelength in the 600-nm band (e.g. 650 nm) are integrated on a common n-type GaAs substrate 40 in a mutually separated state. A substrate that has, for instance, a (100) crystal plane orientation, or a substrate whose major surface is a surface tilted, for instance, by 5° to 15° from the (100) plane, is used as the n-type GaAs substrate 40.

The AlGaAs semiconductor laser LD1 is made up of an n-type GaAs buffer layer 41, an n-type AlGaAs cladding layer 42, an active layer 43 having a single quantum well (SQW) structure or a multiple quantum well (MQW) structure, a p-type AlGaAs cladding layer 44, and a p-type GaAs capping layer 45, all of them superposed on the substrate 40. The upper portion of the p-type AlGaAs cladding layer 44 and p-type GaAs capping layer 45 have a stripe-like shape extending in one direction. An n-type GaAs current confinement layer 46 is provided on both sides of this stripe-like portion, thereby forming a current confinement structure. A p-electrode 47 is provided on top of the stripe-shaped p-type GaAs capping layer 45 and n-type GaAs current confinement layer 46 in ohmic contact with the p-type GaAs capping layer 45. The p-electrode 47 is, for instance, a Ti/Pt/Au electrode.

The AlGaInP semiconductor laser LD2 is made up of an n-type GaAs buffer layer 51, an n-type AlGaInP cladding layer 52, an active layer 53 having an SQW or MQW structure, a p-type AlGaInP cladding layer 54, a p-type GaInP intermediate layer 55, and a p-type GaAs capping layer 56, all of them superposed on the substrate 40. The upper portion of the p-type AlGaInP cladding layer 54, p-type GaInP intermediate layer 55, and p-type GaAs capping layer 56 have a stripe-like shape extending in one direction. An n-type GaAs current confinement layer 57 is provided on both sides of this stripe-like portion, thereby forming a current confinement structure. A p-electrode 58 is provided on top of the stripe-shaped p-type GaAs capping layer 56 and n-type GaAs current confinement layer 57 in ohmic contact with the p-type GaAs capping layer 56. The p-electrode 58 is, for instance, a Ti/Pt/Au electrode.

An n-electrode 59 is provided on the back side of the n-type GaAs substrate 40 in ohmic contact with the n-type GaAs substrate 40. This n-electrode 59 is, for instance, an AuGe/Ni electrode or an In electrode.

The p-electrode 47 of the AlGaAs semiconductor laser LD1 and p-electrode 58 of the AlGaInP semiconductor laser LD2 are soldered to heat sinks H1, H2 provided on a package base 60 in a mutually electrically isolated state.

In this conventional integrated semiconductor laser device constructed as described above, the AlGaAs semiconductor laser LD1 can be driven by passing electric current between the p-electrode 47 and n-electrode 59, and the AlGaInP semiconductor laser LD2 can be driven by passing electric current between the p-electrode 58 and n-electrode 59. In addition, laser light of the 700-nm wavelength band (e.g. 780 nm) can be extracted by driving the AlGaAs semiconductor laser LD1 and laser light of the 600-nm wavelength band (e.g. 650 nm) can be extracted by driving the AlGaInP semiconductor laser LD2. The selection between driving the AlGaAs semiconductor laser LD1 or driving the AlGaInP semiconductor laser LD2 can be made by switching an external switch.

As noted above, this conventional integrated semiconductor laser device has the AlGaAs semiconductor laser LD1 with an emission wavelength in the 700-nm band and the AlGAInP semiconductor laser LD2 with an emission wavelength in the 600-nm band, and, as a result, is capable of producing laser light for DVDs and laser light for CDs or MDs independently of each other. Therefore, installing this integrated semiconductor laser device as a laser light source in the optical pickup units of DVD devices allows for reproduction or recording of DVDs, CDs, and MDs. Moreover, this integrated semiconductor laser device has only one package because the AlGaAs semiconductor laser LD1 and AlGaInP semiconductor laser LD2 have laser structures formed of semiconductor layers grown up on the common n-type GaAs substrate 40. This makes it possible to make the optical pickup smaller and, therefore, permits reduction in the size of DVD devices.

Moreover, rewriting an optical disk at high speed requires the radiant output of the semiconductor laser to be as high as possible. For instance, rewriting a DVD optical disk at a high speed of 4× or more requires a high power of 100 mW or more in terms of the radiant output. In order to obtain such a high power, it is necessary to prevent COD (Catastrophic Optical Damage), during which the facet of the semiconductor laser is melted and destroyed by its own radiant output during high power operation. Decreasing the radiant density at the cavity facet in order to suppress heat generation is effective in preventing COD. For this purpose, it is effective to use a dielectric substance, such as $SiO_2$, $Al_2O_3$, or amorphous Si, etc., to coat the front facet of the semiconductor laser, which is used for the extraction of laser light, in order to lower the reflectivity of the front facet.

In general, when the facet is not coated, the reflectivity of the cavity facet in a semiconductor laser made up of an AlGaInP material or AlGaAs material is approximately 30%.

In such a case, approximately 30% of the laser light is reflected by the cavity facet and fed back into the resonator and approximately 70% of the light is extracted from the front facet. In contrast, when it is coated with a dielectric film in such a manner that the reflectivity of the front facet is set, for instance, to 10%, 10% of the laser light is reflected by the cavity facet and fed back into the resonator, and 90% of the light is extracted from the front facet. In other words, if the reflectivity of the front facet is reduced while maintaining the same radiant output from the front facet, the radiant density at the cavity facet can be decreased as well. Therefore, decreasing the reflectivity of the front facet leads to an increase in the COD level and is an effective measure for obtaining a high-power laser.

In addition, if the reflectivity of the rear facet, i.e. the facet on the side opposite the cavity facet used for the extraction of laser light, is set to a high level, then the efficiency of light extraction from the front facet of the semiconductor laser can be further improved. Accordingly, facet coating conditions aimed at mining the reflectivity of the front facet and, conversely, at increasing the reflectivity of the rear facet, are employed widely in high-power semiconductor lasers. For the above-mentioned reasons, in order to enable high power operation in a two-wavelength laser integrating semiconductor lasers emitting in the red and infrared region on a common substrate, the facets of the laser cavities are coated with dielectric films capable of simultaneously obtaining both low reflectivity and high reflectivity for red and infrared light.

However, even if the facets are coated as described above, the bandgap energy of the active layer at the laser cavity facets is affected by the surface level and becomes smaller than the bandgap energy of the active layer inside the resonator. Moreover, when current injection is performed in a semiconductor laser, the bandgap energy of the active layer is reduced under the influence of joule heating or non-radiative recombination in the active layer. In particular, because the reflectivity of the front facet in a high power laser is reduced as described above, the radiant density of the active layer in the vicinity of the front facet reaches the highest level in the resonator, making it susceptible to temperature increase. For this reason, the bandgap energy of the active layer in the vicinity of the front facet is further diminished, laser light absorption losses are increased, and more heat is generated. As a result, COD tends to occur at the facet.

To prevent such facet damage, it is known to disorder the quantum well active layer in the vicinity of laser facets by impurity diffusion in order to form facet window structures and increase the bandgap energy of the active layer in the vicinity of the facets in advance. As a result, even if the bandgap of the active layer in the vicinity of the facet is diminished by heat generation, it becomes possible to maintain it in a state that is practically transparent to laser radiation and increase the radiant output level at which COD takes place.

Moreover, the demand for light sources used for optical disc systems capable of high-speed writing, such as CD-Rs intended for 48× recording and DVDs intended for 16× recording, which perform not only reproduction functions, but also recording functions as well, will be increasing in the future. In this case, lasers used as such light sources will have to be capable of high-power operation at levels of at least 250 mW even during high-temperature operation at 80° C. or higher.

As described above, when a semiconductor laser is operated at a high power level, the cavity facet on the side used for the extraction of laser light (front facet) and cavity facet on the opposite side (rear facet) are coated with dielectric films having, respectively, a low reflectivity of not more than 10% (AR, Anti-Reflection) and a high reflectivity of not less than 85% (HR, High-Reflection). Such low reflectivity and high reflectivity coatings bring about improvement in the external differential quantum efficiency (slope efficiency) of the current vs. radiant output characteristic and provide for a high radiant output using a small amount of injection current. In addition, conducting the impurity diffusion-based disordering of the quantum well active layer in the vicinity of the facet prevents COD, which causes the laser facet to be melted and destroyed by radiant output of laser light itself.

When impurity diffusion is boosted, such as by increasing the duration of impurity diffusion or diffusing impurities in high concentration, COD is rendered less likely even at higher radiant output levels because the disordering of the quantum well active layer in the window region becomes more pronounced, the bandgap energy is increased further, and the region becomes more transparent to laser light.

However, if impurity diffusion is boosted excessively, the diffusion of the impurity ends up reaching the vicinity of the substrate. Structures used widely in modern semiconductor lasers intended for CD and DVD optical discs are such that an n-type GaAs substrate is employed as the substrate, an n-type GaAs buffer layer is grown thereon, followed by growing an n-type cladding layer, an active layer, and a p-type cladding layer on top of them, and current injection stripes are formed in a high-resistivity p-type layer. Moreover, a technology is used widely, in which a quantum well active layer is employed as the active layer, with said quantum well active layer disordered using Zn as an impurity that is diffused to form a window region at the facet.

However, with respect to compound semiconductors formed of Group III-V semiconductors, Zn acts as an impurity producing p-type semiconductors, and, therefore, when impurity diffusion intended for window formation is boosted excessively as described above, the n-type cladding layer is rendered p-type and a p-n junction ends up formed between it and the n-type buffer layer in the vicinity of the substrate, which is of the n-type. As a result, if the turn-on voltage (Vw) of the p-n junction between a window region and an n-type buffer layer becomes smaller than the turn-on voltage (Va) of the p-n junction of the active layer in the portion other than the window region, the electric current injected from the electrode flows through the window region, which has a small turn-on voltage.

The above-mentioned phenomenon will now be illustrated specifically with reference to the double heterostructures of red lasers, which are currently widely used. The structure of modern red lasers includes an n-type GaAs buffer layer, an n-type AlGaInP cladding layer, a quantum well active layer composed of AlGaInP/GaInP, and a p-type AlGaInP cladding layer, all formed on an n-type GaAs substrate. In this structure, when the quantum well active layer in the vicinity of the facets is disordered by the Zn diffusion to form window structures, the rate of diffusion of Zn, i.e. the impurity, is higher in AlGAInP materials than in AlGaAs materials including GaAs. For this reason, Zn rapidly diffuses across the n-type AlGaInP cladding layer into the vicinity of the n-type GaAs buffer layer interface, where the rate of diffusion is slower.

As a result of the Zn diffusion, inside the laser element, there appear a p-n junction (T1) formed between the GaAs buffer layer and AlGaInP cladding layer rendered p-type by the diffusion of the impurity and a p-n junction (T2) formed by the active layer in the portion other than the window regions. The turn-on voltage of the p-n junction in the portion other than the window regions is almost equal to the bandgap energy of the quantum well active layer, and the bandgap energy of the GaAs is smaller than the energy of red light with a wavelength of 650 nm. Consequently, the turn-on voltage of the p-n junction Ti becomes smaller than that of the p-n junction T2, and the electric current injected from the p-type AlGaInP cladding layer flows across the p-n junction T1, which has a low turn-on voltage. Therefore, injected electric current is not injected into the active layer that has not been disordered, the radiant efficiency decreases, and the reactive current causes an increase in the operating current value and deterioration in the temperature characteristic. This makes it difficult to obtain a high power characteristic of several hundred mW or more and poses serious obstacles for element reliability.

When the p-n junction T1 is formed between the n-type GaAs buffer layer and AlGaInP cladding layer rendered p-type by the diffusion of the impurity when the disordering of the quantum well active layer is boosted in the above-described manner in order to increase the transparency of the window regions to laser radiation, the loss current component, which does not contribute to the laser oscillation flowing across the junction T1, is increased. Consequently, the radiant efficiency decreases, the operating current value increases, the temperature characteristic decreases, and it becomes more difficult to obtain a high power characteristic of 250 mW or more under high-temperature conditions of 80° C. or higher.

Figure 8:
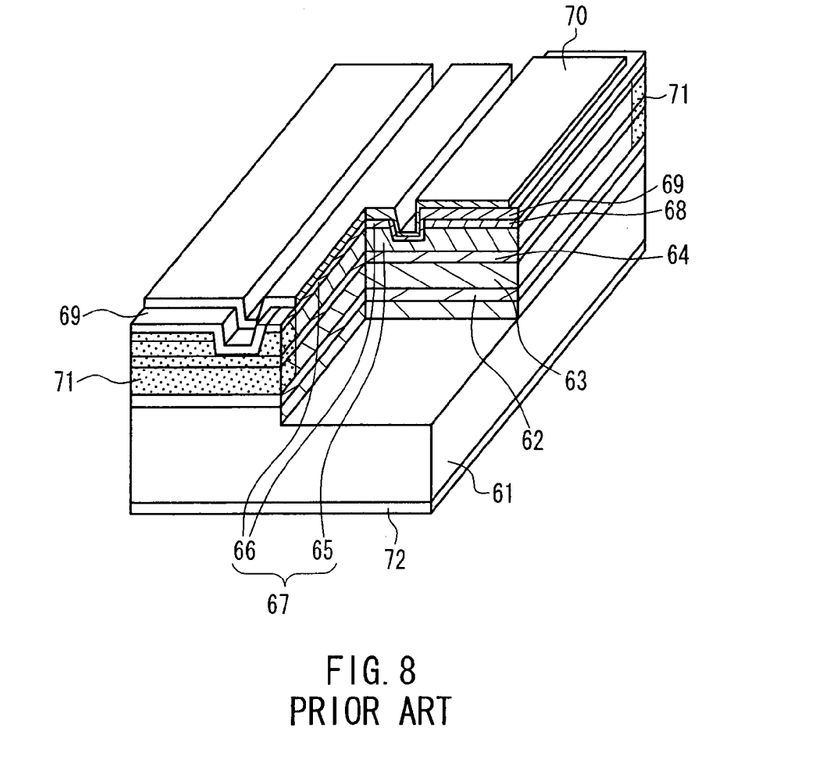
FIG. 8 is a perspective view of a partial cross-section of another conventional semiconductor laser device.

An exemplary semiconductor laser device configuration provided to address such problems is disclosed in JP 2003-31901A. FIG. 8 shows a partial cutout perspective view of the semiconductor laser device. This semiconductor laser device has a structure in which a buffer layer having a bandgap larger than the bandgap of the quantum well structure active layer is located on a semiconductor substrate and, at the same time, window regions are formed by introducing impurities into the quantum well structure active layer in the vicinity of the facets of the semiconductor laser.

The semiconductor laser of FIG. 8 is a ridge-type semiconductor laser with an emission wavelength of 630 to 690 nm and a pulsed output of not less than 50 mW. A buffer layer 62, which is composed, for instance, of Si-doped n-AlGaAs, and, furthermore, a lower cladding layer 63 made up of n-AlGaInP, are positioned on top of a Si-doped n-GaAs substrate 61. An MQW active layer 64 is arranged on top of the lower cladding layer 63. The MQW active layer has a GaInP/AlGaInP MQW configuration.

N-AlGaAs with an aluminum composition ratio of not less than 0.3, which is a material having a larger bandgap than the MQW active layer 64, is used for the buffer layer 62. In addition, AlGaAs is a material in which Zn exhibits a smaller rate of diffusion than in AlGaInP.

An upper cladding layer 65 composed of p-AlGaInP and, furthermore, a contact layer 66 composed of p-GaAs are positioned on top of the MQW active layer 64. The upper cladding layer 65 and contact layer 66 are formed in the shape of a stripe mesa, thereby forming an optical waveguide 67. With the exception of the contact layer 66, which is located in the top portion of the optical waveguide 67, the side faces of the optical waveguide 67, the upper cladding layer 65, which is exposed when the optical waveguide 67 is formed, as well as a p-GaAs layer 68, which is formed simultaneously with the contact layer 66, are covered with an insulating film 69, which is made up of $SiO_2$ or the like.

A surface p-electrode 70 is arranged on the surface of the insulating film 69 and contact layer 66, thereby providing connection to the contact layer 66 and forming a current path across the optical waveguide 67 to the MQW active layer 64.

Window regions 71 are formed in the vicinity of the chip's two facets serving as exit facets on both sides of the optical waveguide 67. The window regions 71 are regions in which the MQW active layer 64 is disordered by the introduction of Zn diffused as an impurity from the surface of the upper cladding layer 65. The window regions 71 include the upper cladding layer 65, MQW active layer 64, and lower cladding layer 63. The contact layer 66 is removed and the insulating film 69 is disposed on the surface of the window region 71. An n-side back electrode 72 is arranged on the back side of the n-GaAs substrate 61.

Because in this structure the lower cladding layer 63 is formed of an n-AlGaInP layer, the rate of diffusion of Zn in the n-AlGaInP layer is high. However, the rate of diffusion of Zn in the n-AlGaAs layer, which constitutes the buffer layer 62, is low, and, as a result, the diffusion of Zn is controlled to stop at the boundary between the lower cladding layer 63 and upper buffer layer 62. However, in some cases Zn is diffused into the buffer layer 62 and a p-n junction ends up being formed in the buffer layer 62.

However, in this conventional example, as a result of using n-AlGaAs having an aluminum composition ratio of not less than 0.3 and a bandgap larger than the bandgap of the MQW active layer 64 for the buffer layer 62, the decrease in the forward turn-on voltage $V_f$ is suppressed and the generation of leak currents is suppressed even when the window regions 71 are formed by Zn diffusion. Therefore, in this semiconductor laser, initial turn-on takes place in the MQW active layer 64 and no initial turn-on occurs at the p-n junction in the buffer layer 62. For this reason, the generation of leak currents that accompanies the decline in the voltage $V_f$ is suppressed.

As noted above, the generation of reactive currents, which do not contribute to the laser oscillation flowing through the window portions, can be suppressed even if the diffusion of the impurity reaches the vicinity of the buffer layer when the impurity diffusion-based disordering of the window quantum well active layer is boosted in order to obtain a laser with a high COD level.

On the other hand, configurations intended for suppressing the generation of the above-described reactive currents flowing through the window portions, which are caused by boosting the impurity diffusion-based disordering aimed at forming the window regions, also are required in case of integrated semiconductor laser devices comprising multiple types of semiconductor lasers with different emission wavelengths. However, the setting of conditions suitable for forming multiple types of semiconductor lasers has not been addressed sufficiently in the past.

SUMMARY OF THE INVENTION

It is an object of the present invention to provide a two-wavelength semiconductor laser device, in which two types of semiconductor lasers integrated on a common substrate both are set to conditions suitable for suppressing the generation of reactive currents flowing through the window regions, which are caused by boosting the disordering intended for window region formation.

A two-wavelength semiconductor laser device according to the invention has, integrated on a common substrate, a first semiconductor laser and second semiconductor laser, each including a first conductivity type buffer layer, a first conductivity type cladding layer, a quantum well active layer, and a second conductivity type cladding layer and has a stripe geometry used for carrier injection, with the quantum well active layers in the vicinity of the cavity facets being disordered by impurity diffusion.

In order to solve the above-mentioned problems, relationships expressed by the following formulas are satisfied, $\lambda1 > \lambda b1, \lambda2 > \lambda b2, \lambda1 > \lambda2,$ and $E1 \leq E2$ where $\lambda1$ is defined as the emission wavelength of the active layer of the first semiconductor laser, $\lambda2$ as the emission wavelength of the second semiconductor laser, E1 as the band gap energy of the buffer layer in the first semiconductor laser, E2 as the band gap energy of the buffer layer in the second semiconductor laser, $\lambda b1$ as the wavelength corresponding to the band gap energy of the buffer layer in the first semiconductor laser, and $\lambda b2$ as the wavelength corresponding to the band gap energy of the buffer layer in the second semiconductor laser.

The two-wavelength semiconductor laser device having such a configuration can render the turn-on voltage of the p-n junction formed between the cladding layer and the buffer layer under the window region larger than the turn-on voltage of the p-n junction in the portion of the active layer other than the window regions and makes it possible to suppress the generation of reactive currents flowing through the window regions for both types of semiconductor lasers with different wavelengths integrated on the common substrate. As a result, it becomes possible to obtain a two-wavelength semiconductor laser device with a high COD level having a superior temperature characteristic that enables it to be operated at elevated temperatures.

The method for fabricating the two-wavelength semiconductor laser device according to the invention includes: forming a double heterostructure for a first semiconductor laser by superposing a first conductivity type buffer layer, a first conductivity type cladding layer, a quantum well active layer composed of an AlGaAs material including GaAs, and a second conductivity type cladding layer on a substrate; forming a double heterostructure for a second semiconductor laser by superposing a first conductivity type buffer layer, a first conductivity type cladding layer, a quantum well active layer composed of an AlGaInP material including InGaP, and a second conductivity type cladding layer in a region obtained by removing a part of the double heterostructure of the first semiconductor laser by etching; disordering the quantum well active layers in the vicinity of the cavity facets by a common step of impurity diffusion in the first semiconductor laser and second semiconductor laser; and forming ridge shapes serving as current injection stripes by a common step of etching the first semiconductor laser and second semiconductor laser.

Relationships expressed by the following formulas are satisfied, $\lambda1 > \lambda b1, \lambda2 > \lambda b2, \lambda1 > \lambda2,$ and $E1 \leq E2$ where $\lambda1$ is defined as the emission wavelength of the active layer of the first semiconductor laser, $\lambda2$ as the emission wavelength of the second semiconductor laser, E1 as the band gap energy of the buffer layer in the first semiconductor laser, E2 as the band gap energy of the buffer layer in the second semiconductor laser, $\lambda b1$ as the wavelength corresponding to the band gap energy of the buffer layer in the first semiconductor laser, and $\lambda b2$ as the wavelength corresponding to the band gap energy of the buffer layer in the second semiconductor laser.

Since this method for fabricating the two-wavelength semiconductor laser device allows for suppressing the generation of lattice defects due to the difference in the coefficients of thermal expansion between the GaAs substrate and buffer layer of the first semiconductor laser, which is imparted with a substantial thermal history during regrowth, the decline in the reliability of the first semiconductor laser due to lattice defect generation can be suppressed. Moreover, using an AlGaAs buffer layer with a high compositional ratio of Al as the buffer layer in the second semiconductor laser, which has a short thermal history, makes it possible to suppress the generation of the reactive currents, which do not contribute to the laser oscillation flowing through the window portions. Therefore, the fabrication method according to the invention makes it possible to obtain a two-wavelength semiconductor laser of superior temperature characteristics and high reliability, capable of suppressing degradation in element operation both in the first and second semiconductor lasers.

DETAILED DESCRIPTION OF THE INVENTION

Based on the above-mentioned configuration, the two-wavelength semiconductor laser device of the invention can assume the following various configurations.

Specifically, it is preferable that the relationship E1<E2 be satisfied in the two-wavelength semiconductor laser device of the above-described configuration.

Moreover, a configuration can be used in which the cladding layers in the first semiconductor laser and second semiconductor laser are composed of an AlGaInP material. This configuration makes it possible to carry out ridge formation in the two-wavelength semiconductor laser in a simultaneous manner and permits simplification of the element fabrication process and a reduction in the cost of the elements.

Moreover, a configuration can be used in which the active layer of the first semiconductor laser is composed of an AlGaAs material including GaAs, and the active layer of the second semiconductor laser is composed of an AlGaInP material including InGaP. This configuration makes it possible to obtain a two-wavelength semiconductor laser device emitting in the infrared and red regions.

Moreover, a configuration can be used, in which the buffer layer is composed of an AlGaAs material. This configuration makes it possible to increase the bandgap wavelength of the buffer layer in comparison with that of GaAs, and when a p-n junction is formed by impurity diffusion in the buffer layer under the window region, it becomes possible to raise the turn-on voltage of this p-n junction and, for both lasers, it becomes possible to suppress the generation of the reactive currents, which do not contribute to the laser oscillation flowing across the p-n junction formed by impurity diffusion.

In this configuration, it is preferable that the first semiconductor laser is an infrared laser and the second semiconductor laser is a red laser, and that the buffer layer composed of an AlGaAs material satisfies relationships expressed by the formulas, $$X1 \geq 0, X2 > 0.37, X2 \geq X1$$

where X1 is defined as the compositional ratio of Al in the infrared laser and X2 as the compositional ratio of Al in the red laser:

This configuration makes it easier to suppress the generation of the reactive currents, which do not contribute to the laser oscillation flowing through the window regions, and, furthermore, makes it possible to reduce the difference between the lattice constants of the substrate and buffer layer generated in the infrared laser. As a result, it is possible to suppress the proliferation of the lattice defects generated in the buffer layer of the infrared laser during the thermal history associated with the growth of the double heterostructure of the red laser.

In this case, it is preferable that the relationship X2>X1 be satisfied.

Zn can be used as the impurity. As a result, it becomes possible to easily disorder the quantum well active layer, and window regions can be reliably formed in both types of lasers.

It is preferable that the relationship E1<E2 be satisfied in the method for fabrication of the two-wavelength semiconductor laser device of the above-described configuration.

EMBODIMENTS

Figure 1:
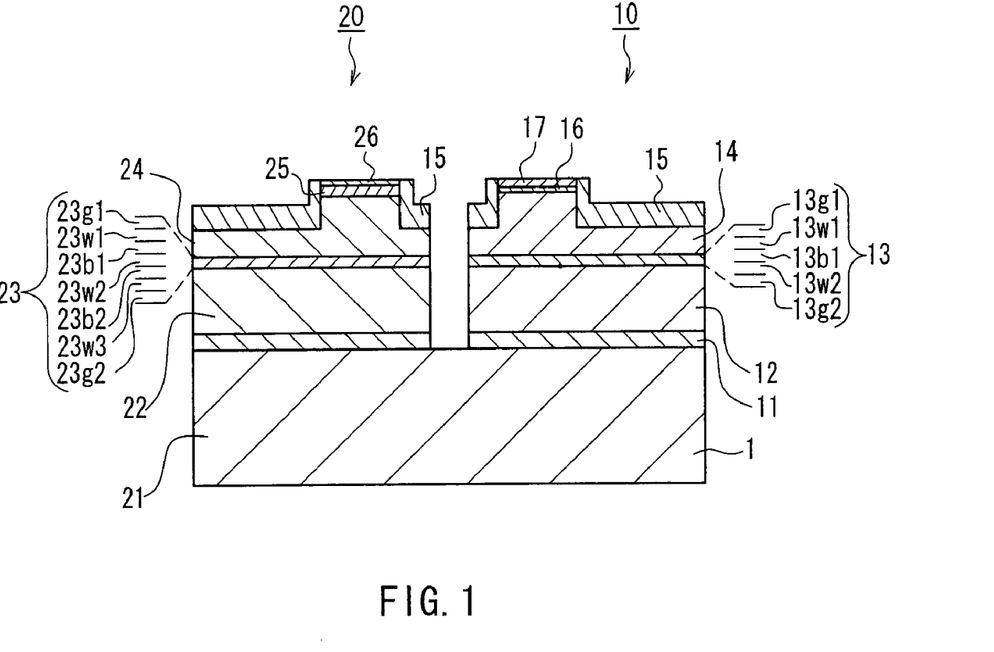
FIG. 1 is a cross-sectional view of a schematic structure of a semiconductor laser according to an embodiment of the present invention.

Hereinafter, embodiments of the present invention will be described in detail with reference to drawings. FIG. 1 a cross-sectional view of the schematic structure of the semiconductor laser device according to the present embodiment.

This semiconductor laser device uses an n-type GaAs substrate 1, whose major surface is a surface tilted 10° in the [011] direction from the (100) plane, and has an infrared laser 10 and a red laser 20 integrated on an n-type GaAs substrate 1.

First of all, explanations will be provided regarding the structure of the infrared laser 10. The infrared laser 10 has a layered structure composed of a buffer layer 11 (n-type AlGaAs, film thickness: 0.5 μm), an n-type cladding layer 12 (n-type $(Al_{0.7}Ga_{0.3})_{0.51}In_{0.49}P$, film thickness: 2.0 μm), a quantum well active layer 13, a p-type cladding layer 14 (p-type $(Al_{0.7}Ga_{0.3})_{0.51}In_{0.49}P$), a protective layer 16 (p-type $Ga_{0.51}In_{0.49}P$, film thickness: 500 Å), and a contact layer 17 (p-type GaAs, film thickness 0.4 μm). Moreover, a current blocking layer 15 (n-type AlInP, film thickness: 0.7 μm) is formed on the side faces of the ridge.

The quantum well active layer 13 comprises a first guiding layer 13g1 ($Al_{0.5}Ga_{0.5}As$), well layers 13w1 and 13w2 (GaAs), a barrier layer 13b1 ($Al_{0.5}Ga_{0.5}As$), and a second guiding layer 13g2 ($Al_{0.5}Ga_{0.5}As$). The p-type cladding layer 14 is formed in such a manner that the distance from the top of the ridge to the active layer 13 is 1.4 μm and the distance dp from the lower end portion of the ridge to the active layer 13 is 0.24 μm.

In this structure, electric current injected from the contact layer 17, which is confined only to the ridge portion by the current blocking layer 15, is concentrated on and injected into the active layer 13 located below the bottom of the ridge, and a state of carrier population inversion, which is required for laser oscillation, is implemented using a small injection current of several tens of mA. At such time, light emitted as a result of recombination of the carriers injected into the active layer 13 is subject to vertical optical confinement by the n-type cladding layer 12 and p-type cladding layer 14 in a direction normal to the active layer 13, and horizontal optical confinement in a direction parallel to the active layer 13 takes place because the index of refraction of the current blocking layer 15 is lower than that of the p-type cladding layer 14.

Moreover, because the current blocking layer 15 is transparent to laser radiation, there is no light absorption, and a low-loss waveguide can be implemented. Furthermore, since the distribution of light propagating through the waveguide permits considerable seepage into the current blocking layer 15, a Δn on the order of $10^{-3}$, which is suitable for high-power operation, can be obtained easily. Furthermore, its magnitude also can be controlled precisely within limits on the order of $10^{-3}$ based on the magnitude of the dp. For this reason, it is possible to obtain a high-power semiconductor laser having a low operating current while precisely controlling light distribution.

On the other hand, the red laser 20 has a layered structure comprising a buffer layer 21 (n-type AlGaAs, film thickness: 0.5 μm), an n-type cladding layer 22 (n-type $(Al_{0.7}Ga_{0.3})_{0.5}In_{0.49}P$, film thickness: 2.0 μm), a strained quantum well active layer 23, a p-type cladding layer 24 (p-type $(Al_{0.7}Ga_{0.3})_{0.51}In_{0.49}P$), a protective layer 25 (p-type $Ga_{0.51}In_{0.49}P$, film thickness: 500 Å), and a contact layer 26 (p-type GaAs, film thickness 0.4 μm). Moreover, a current blocking layer 15 (n-type AlInP, film thickness: 0.7 μm) is formed on the side faces of the ridge.

The strained quantum well active layer 23 comprises a first guiding layer 23g1 ($Al_{0.5}Ga_{0.5})_{0.51}In_{0.49}P$), well layers 23w1 to w3 (GaInP), barrier layers 23b1, 23b2 (AlGaInP), and a second guiding layer 23g2 (AlGaInP). The p-type cladding layer 24 is formed in such a manner that the distance from the top of the ridge to the active layer 23 is 1.4 μm and the distance dp from the lower end portion of the ridge to the active layer 23 is 0.2 μm.

In this structure, electric current injected from the contact layer 26, which is confined only to the ridge portion by the current blocking layer 15, is concentrated on and injected into the active layer 23 located below the bottom of the ridge, and a state of carrier population inversion, which is required for laser oscillation, is realized using a small injection current of several tens of mA. At such time, light emitted as a result of recombination of the carriers injected into the active layer 23 is subject to vertical optical confinement by the n-type cladding layer 22 and p-type cladding layer 24 in a direction normal to the active layer 23 and horizontal optical confinement in a direction parallel to the active layer 23 takes place because the index of refraction of the current blocking layer 15 is lower than that of the p-type cladding layer 24.

Moreover, because the current blocking layer 15 is transparent to laser radiation, there is no light absorption, and a low-loss waveguide can be implemented. Furthermore, since the distribution of light propagating through the waveguide permits considerable seepage into the current blocking layer 15, in the same manner as in case of the red laser 10, a Δn on the order of $10^{-3}$, which is suitable for high-power operation, can be obtained easily, and, moreover, its magnitude also can be precisely controlled within limits on the order of $10^{-3}$ based on the magnitude of the dp. For this reason, it is possible to obtain a high-power semiconductor laser having a low operating current while precisely controlling light distribution.

In the present embodiment, the length of the resonator is 1750 μm. This is due to the fact that it is desirable to make the length of the resonator not less than 1500 μm so as to reduce operating current density in a high-power laser with an output of at least 350 mW in order to improve heat dissipation during high-temperature operation at 80° C. or higher.

Dielectric films (not shown) are formed on the front facet and rear cavity facet in such a manner that their respective reflectivity to infrared laser light and red laser light is 7% and 94%.

Explanations will now be provided regarding the magnitude of the Al compositional ratio X1 of the n-type AlGaAs buffer layer 11 of the infrared laser 10 and the Al compositional ratio X2 of the n-type AlGaAs buffer layer 21 of the red laser 20.

Figure 2:
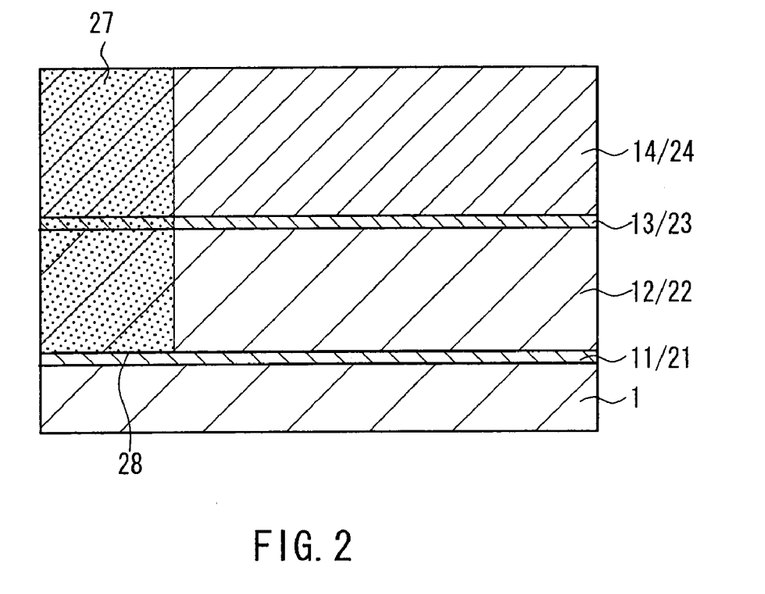
FIG. 2 is a diagram illustrating a p-n junction formed by an n-type AlGaAs buffer layer and cladding layer rendered p-type by impurity diffusion under a window region.

When Zn is diffused for the purpose of window region formation and the rate of diffusion is raised using various methods such as increasing the duration of diffusion or raising the temperature of Zn diffusion, as shown in FIG. 2, a Zn diffusion region 27 is formed up to the interface between the n-type AlGaInP cladding layer 12/22 and buffer layer 11/21. This is due to the fact that the rate of Zn diffusion is high in AlGaInP materials and low in AlGaAs materials, as a result of which, when the Zn diffusion reaches the AlGaAs buffer layer 11/21, the rate of diffusion across the AlGaAs layer becomes relatively slow and the progress of the Zn diffusion in the depth direction stops at the interface between the n-type AlGaInP cladding layer 12/22 and AlGaAs buffer layer 11/21.

At such time, the turn-on voltage of a p-n junction 28 formed by the n-type cladding layer 12/22 rendered p-type by impurity diffusion and the AlGaAs buffer layer 11/21 in the window region, becomes greatly dependent on the compositional ratio of Al in the AlGaAs buffer layer 11/21.

Figure 3:
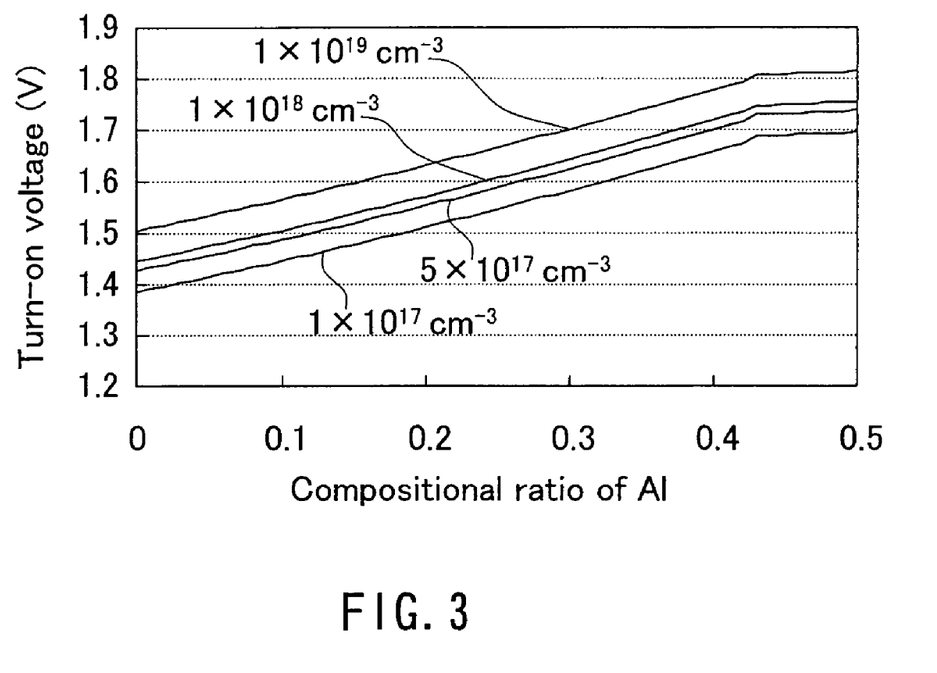
FIG. 3 is a diagram illustrating the results of turn-on voltage calculation for a p-n junction formed by an n-type AlGaAs buffer layer and cladding layer rendered p-type by impurity diffusion under a window region.

FIG. 3 illustrates the results of turn-on voltage calculation for the p-n junction formed by the n-type AlGaAs buffer layer and p-type $(Al_{0.7}Ga_{0.3})_{0.51}In_{0.49}P$ cladding layer. In the calculations, the compositional ratio of Al in the AlGaAs buffer layer was varied from 0 to 0.5. Moreover, the concentration of carriers in the AlGaAs buffer layer was set to $1 \times 10^{18}$ cm$^{-3}$ and the concentration of the p-type impurity in the p-type $(Al_{0.7}Ga_{0.3})_{0.51}In_{0.49}P$ cladding layer was varied between $1 \times 10^{17}$ cm$^{-3}$, $5 \times 10^{17}$ cm$^{-3}$, $1 \times 10^{18}$ cm$^{-3}$, and $1 \times 10^{19}$ cm$^{-3}$. As shown by the test results, when the compositional ratio of Al in the AlGaAs buffer layer is increased, the turn-on voltage increases because the band-gap energy becomes higher. Moreover, even if the concentration of the p-type impurity in the p-type $(Al_{0.7}Ga_{0.3})_{0.51}In_{0.49}P$ cladding layer is increased, the Fermi energy of the p-type cladding layer approaches the edge of the valence band, and as a result the turn-on voltage increases.

When Zn is diffused in order to form a window region, the concentration of the impurity in the diffusion region reaches a high level of about $1 \times 10^{18}$ cm$^{-3}$ or higher. For this reason, when the buffer layer is composed of GaAs, the turn-on voltage of the p-n junction formed by the cladding layer rendered p-type by impurity diffusion and the n-type GaAs buffer layer reaches 1.44V or higher. Therefore, when the diffusion of the impurity reaches the n-type buffer layer, the electric current injected from the electrode will flow through the window region which has a low turn-on voltage, if the turn-on voltage of the p-n junction of the gain region in the portion other than the window regions becomes higher than 1.44V If such a state occurs, the radiant efficiency declines, bringing about an increase in the oscillation threshold current value and operating current value.

Figure 4A:
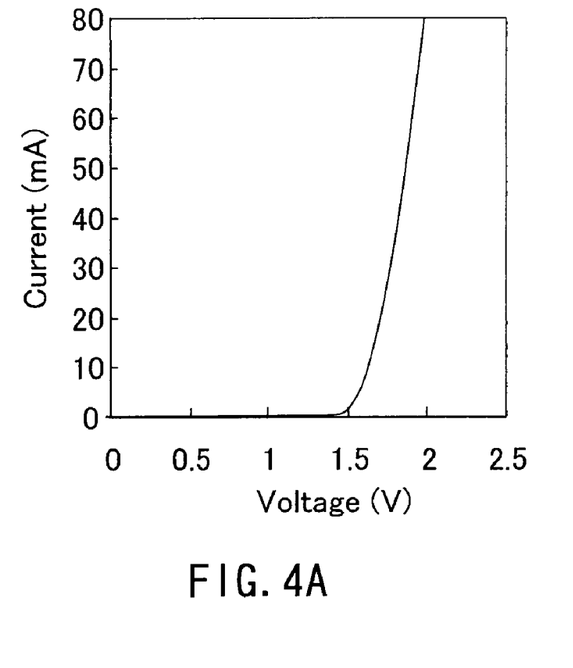
FIG. 4A is a diagram illustrating the results of turn-on voltage measurements in portions other than the window regions when using an infrared laser.
Figure 4B:
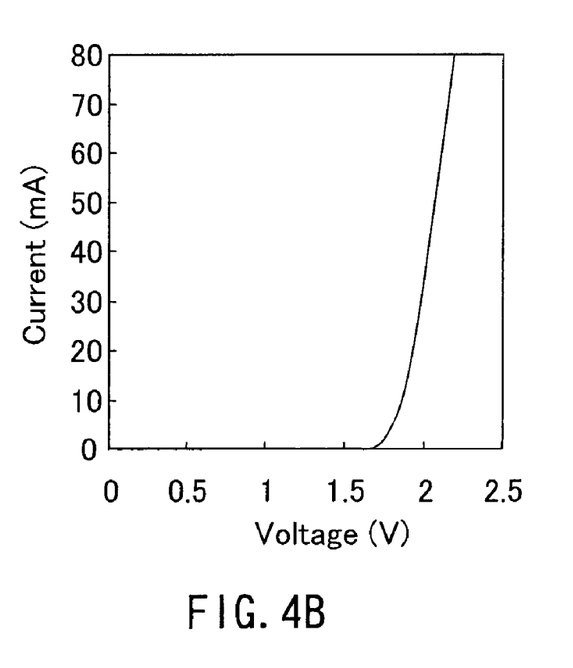
FIG. 4B is a diagram illustrating the results of turn-on voltage measurements in portions other than the window regions when using a red laser.

As shown in FIG. 4A and 4B, the results of turn-on voltage measurement for the p-n junction in the active layer portions other than the window regions of the infrared laser 10 and red laser 20 are 1.45V and 1.7V, respectively. Therefore, based on the calculation results illustrated in FIG. 3, it can be seen that if the Al compositional ratio X1 of the AlGaAs buffer layer 11 of the infrared laser 10 is 0 or higher, the Al compositional ratio X2 of the AlGaAs buffer layer of the red laser 20 is 0.37 or higher, and the impurity concentration in the window region is $1 \times 10^{18}$ cm$^{-3}$ or more, then the turn-on voltage of the p-n junction of the active layer portions other than the window region will be smaller than the turn-on voltage of the p-n junction formed by the AlGaInP cladding layer rendered p-type by impurity diffusion and buffer layer under the window region. In this case, it will be possible to suppress the generation of the reactive currents flowing through the window region.

If the compositional ratio of Al is made excessively high when the AlGaAs buffer layer is grown on the substrate to serve as the buffer layer 11/21, the lattice mismatch and difference in the coefficients of thermal expansion relative to the GaAs substrate 1 will increase. For this reason, lattice defects will be more likely to occur when the temperature is lowered to room temperature from the high level used for crystal growth. Accordingly, the compositional ratio of Al in the AlGaAs used for the buffer layer 11/21 should be as small as possible.

Moreover, considering the structure of the infrared laser 10 and red laser 20, the red laser 20, wherein the cladding layers 22, 24 and quantum well active layer 23 all are formed of an AlGaInP material, exhibits a higher rate of diffusion of Zn, i.e. the p-type impurity, than the infrared laser 10, in which the quantum well active layer 13 is composed of an AlGaAs material. Therefore, the diffusion of Zn from the p-type cladding layer 24 to the active layer 23 will occur more easily. When the impurity is diffused in the active layer 23, generation of non-radiative recombination centers causes a decline in the radiant efficiency, and an increase in the operating current value causes the temperature characteristic to deteriorate.

Consequently, when the two-wavelength semiconductor laser is fabricated, it is desirable to reduce the thermal history imparted to the double heterostructure of the red laser 20 by growing the double heterostructure of the infrared laser 10 prior to the double heterostructure of the red laser 20. In such a case, when the double heterostructure of the red laser 20 is grown, the thermal history load will be applied to the infrared laser 10. Accordingly it is desirable to make the compositional ratio of Al in the AlGaAs buffer layer 11 used in the infrared laser 10 as small as possible in comparison with the compositional ratio of Al in the AlGaAs buffer layer 21 used in the red laser 20 in order to reduce the lattice mismatch and difference in the coefficients of thermal expansion relative to the GaAs substrate 1 as much as possible.

For this reason, if the compositional ratio of AlAs in the buffer layer 11 of the infrared laser 10, which has a low turn-on voltage, is set to a lower level than the compositional ratio of AlAs in the AlGaAs buffer layer 21 of the red laser 20, it is easier to suppress the generation of lattice defects in the infrared laser 10.

In a working example based on this embodiment, the Al compositional ratio X1 in the buffer layer 11 of the infrared laser 10 is set to 0.2, and the Al compositional ratio X2 in the buffer layer 21 of the red laser 20 is set to 0.45. In this case, for the infrared laser 10 and red laser 20, the turn-on voltage of the p-n junction formed by the cladding layer 12/22 rendered p-type by impurity diffusion and the n-type AlGaAs buffer layer 11/21 under the window region, is respectively 1.57V and 1.75V Therefore, the turn-on voltage of the p-n junction formed by the cladding layer 12/22 rendered p-type by impurity diffusion and the n-type AlGaAs buffer layer 11/21 under the window region is higher than the turn-on voltage of the regions other than the window regions and as a result it becomes possible to suppress the generation of the reactive currents that do not contribute to the emitted radiation flowing through the window region.

The above-described conditions can be generally represented in the following manner. Namely, the following conditions are satisfied:

$$\lambda 1 > \lambda b1, \lambda 2 > \lambda b2, \lambda 1 > \lambda 2, \text{ and } E1 \leq E2$$

wherein the emission wavelength of the active layer 13 of the infrared laser 10 (first semiconductor laser) is designated as $\lambda 1$, the emission wavelength of the active layer 23 of the red laser 20 (second semiconductor laser) as $\lambda 2$, the band gap energy of the n-type (first conductivity type) buffer layer 11 in the infrared laser 10 as E1, the band gap energy of the n-type buffer layer 21 in the red laser 20 as E2, the wavelength corresponding to the band gap energy of the buffer layer 11 in the first semiconductor laser as $\lambda b1$, and the wavelength corresponding to the band gap energy of the buffer layer 21 in the second semiconductor laser as $\lambda b2$.

Figure 5A:
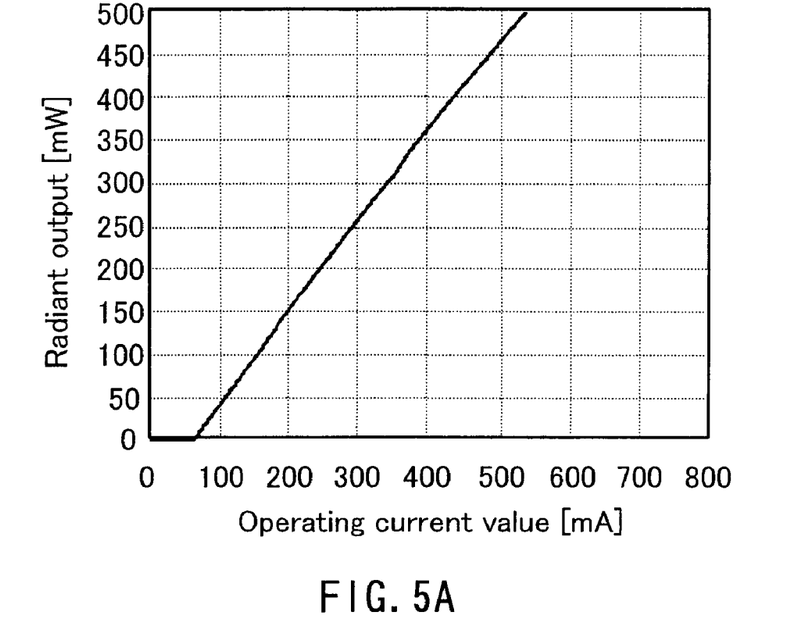
FIG. 5A is a diagram illustrating the results of measurements of the current vs. radiant output characteristic conducted in an embodiment of the present invention using an infrared laser operated at 80° C. for 50 ns with a pulse-duty ratio of 40%.
Figure 5B:
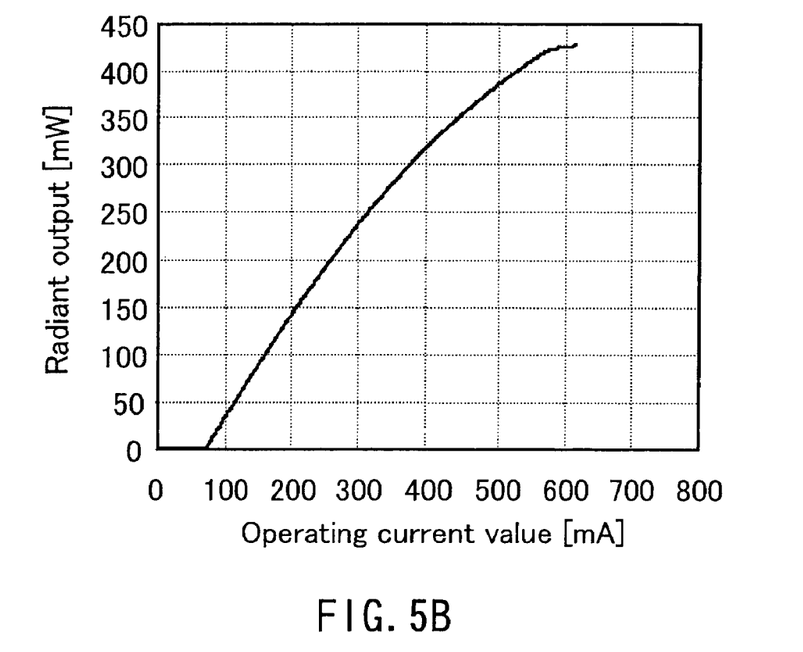
FIG. 5B is a diagram illustrating the results of measurements of the current vs. radiant output characteristic conducted in an embodiment of the present invention using a red laser at 80° C. for 50 ns with a pulse-duty ratio of 40%.

FIGS. 5A, 5B illustrate the respective current vs. radiant output characteristics obtained when operating the infrared laser 10 and red laser 20 at 80° C. for 50 ns with a pulse-duty ratio of 40%. As can be seen, in the infrared laser 10, the shape of the current vs. radiant output characteristic curve is extremely good, with a kink level of not less than 500 mW, and the red laser 20 does not generate kinks up to a radiant output of 400 mW.

Next, explanations will be provided regarding a method of fabricating a semiconductor laser according to an embodiment of the present invention. FIGS. 6A to 6H are a series of cross-sectional views illustrating the steps involved in the method of fabricating a semiconductor laser according to an embodiment of the present invention.

As described above, the rate of Zn diffusion in the red laser, wherein the cladding layers and quantum well active layer are composed of an AlGaInP material, is faster than in the infrared laser, wherein the quantum well active layer is composed of an AlGaAs material. Consequently, when the two-wavelength semiconductor laser is fabricated, it is necessary to reduce the thermal history imparted to the double heterostructure of the red laser by growing the double heterostructure of the infrared laser prior to the double heterostructure of the red laser. Accordingly, in the process of semiconductor laser fabrication according to this embodiment of the present invention, crystal growth used to form the double heterostructure of the infrared laser is carried out prior to that of the red laser.

Figure 6A:
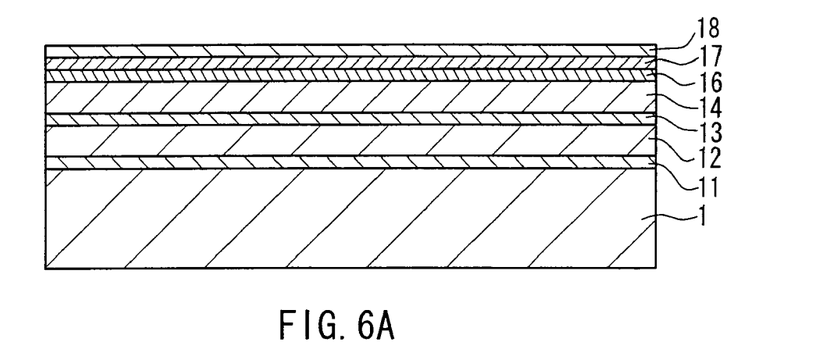
FIGS. 6A to 6H are cross-sectional views illustrating the process of fabricating a semiconductor laser according to an embodiment of the present invention.

An n-type GaAs substrate, whose major surface is a surface tilted 10° in the [011] direction from the (100) plane, is used as the substrate 1. As shown in FIG. 6A, first of all, in a first crystal growing step based on MOCVD or MBE, a buffer layer 11 (n-type AlGaAs, film thickness: 0.5 μm), an n-type cladding layer 12 (n-type $(Al_{0.7}Ga_{0.3})_{0.51}In_{0.49}P$, film thickness: 2.0 μm), a quantum well active layer 13, a p-type cladding layer 14 (p-type $(Al_{0.7}Ga_{0.3})_{0.51}In_{0.49}P$), a protective layer 16 (p-type $Ga_{0.51}In_{0.49}P$ film thickness: 500 Å), a contact layer 17 (p-type GaAs, film thickness 0.4 μm), and a boundary layer 18 (p-type $Ga_{0.51}In_{0.49}P$, film thickness: 0.5 Å) are formed successively on the substrate 1 for use as the infrared laser.

A first guiding layer $(Al_{0.5}Ga_{0.5}As)$, a well layer (GaAs), a barrier layer $(Al_{0.5}Ga_{0.5}As)$, a well layer (GaAs), and a second guiding layer $(Al_{0.5}Ga_{0.5}As)$ are formed successively as the quantum well active layer 13. In the present embodiment, the conductivity type of the active layer may be p-type, n-type, or undoped.

Figure 6B:
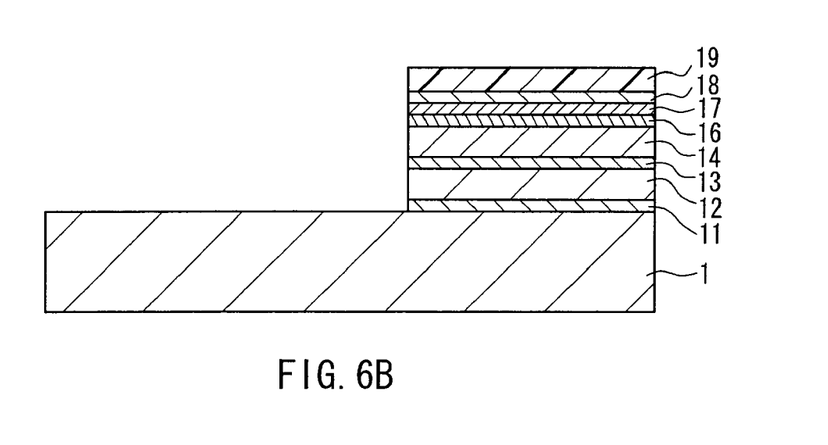

As shown in FIG. 6B, after removing the substrate 1 having the above-mentioned layers formed thereon from the MOCVD or MBE reactor, a resist pattern 19 is formed thereon using photolithography and portions in which the resist pattern 19 is not present are removed with the help of a sulfuric acid-based or hydrochloric acid-based etchant solution using the pattern as a mask.

Figure 6C:
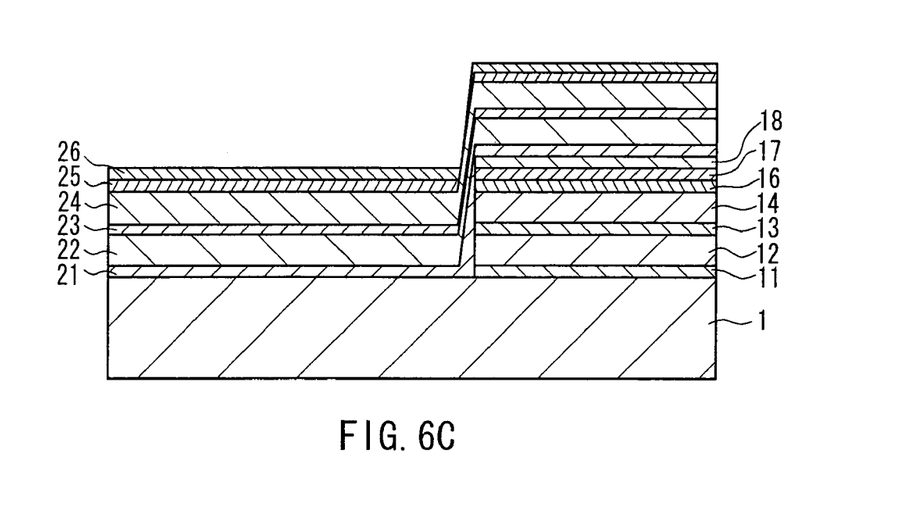

As shown in FIG. 6C, after removing the resist pattern 19, a buffer layer 21 (n-type AlGaAs, film thickness: 0.5 μm), an n-type cladding layer 22 (n-type $(Al_{0.7}Ga_{0.3})_{0.51}In_{0.49}P$, film thickness: 2.0 μm), a strained quantum well active layer 23, a p-type cladding layer 24 (p-type $(Al_{0.7}Ga_{0.3})_{0.51}In_{0.49}P$), a protective layer 25 (p-type $Ga_{0.51}In_{0.49}P$, film thickness: 500 Å), and a contact layer 26 (p-type GaAs, film thickness 0.4 μm) are formed successively by MOCVD or MBE for use as the red laser.

A first $(Al_{0.5}Ga_{0.5})_{0.51}In_{0.49}P$ guiding layer, a GaInP well layer, an (AlGa)InP barrier layer, a GaInP well layer, an (AlGa)InP barrier layer, a GaInP well layer, and a second $(Al_{0.5}Ga_{0.5})_{0.51}In_{0.49}P$ guiding layer are formed successively as the strained quantum well active layer 23.

Figure 6D:
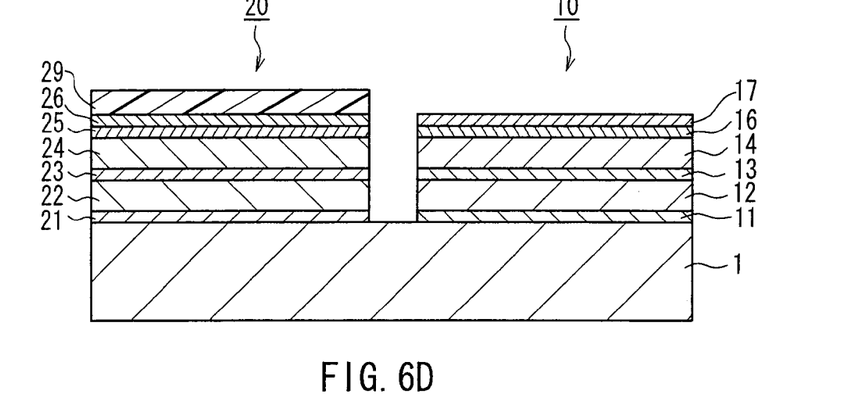

Next, as shown in FIG. 6D, a resist pattern 29 is formed by photolithography on top of the region of the red laser 20. Using the resist pattern 29 as a mask, the buffer layer 21, n-type cladding layer 22, strained quantum well active layer 23, p-type cladding layer 24, protective layer 25, and contact layer 26 are removed by etching with a sulfuric acid-based or hydrochloric acid-based etchant solution in the region of the infrared laser 10 where the resist pattern 29 is not present, so as to leave those layers for the red laser 20.

Figure 6E:
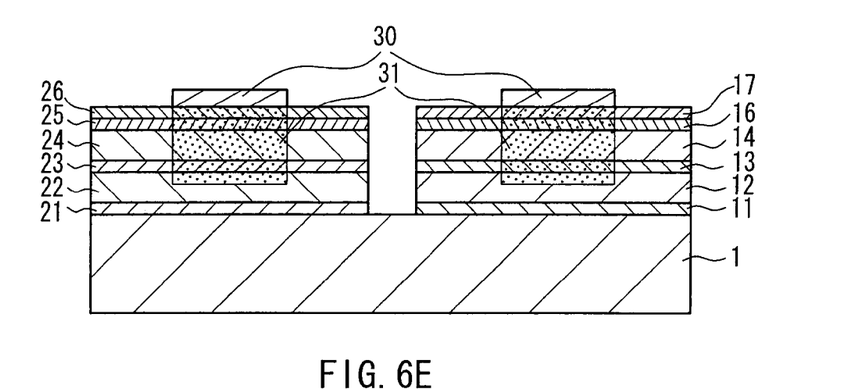

Next, as shown in FIG. 6E, after removing the resist pattern 29, atmospheric pressure thermal CVD (370° C.) is used to deposit diffusion sources 30 and capping films (not shown) on top of the contact layers 17, 26 and photolithography and dry etching techniques are used to perform patterning so as to obtain a preset window length. After that, window regions 31 are formed by conducting annealing and diffusing Zn in the active layer to disorder it, whereupon the diffusion sources 30 are removed.

Figure 6F:
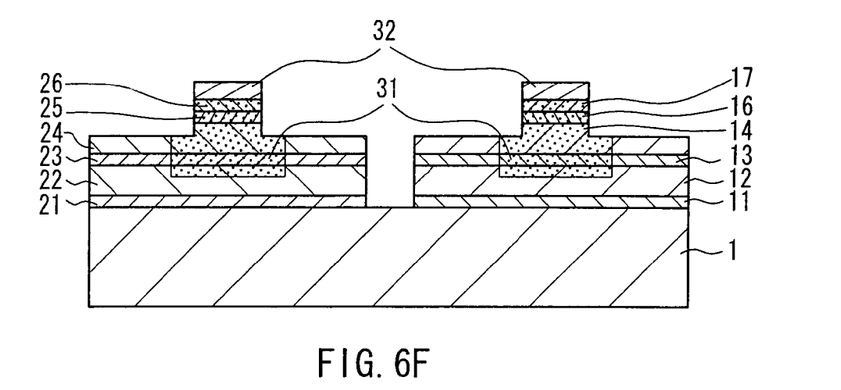

Next, as shown in FIG. 6F, a silicon oxide film deposited using atmospheric pressure thermal CVD (370° C.) so as to have a thickness of 0.3 μm on top of the contact layers 17, 26 is subjected to further patterning using photolithography and dry etching techniques to form a stripe mask 32. The p-type GaAs contact layers 17 and 26, p-type GaInP protective layers 16 and 25, p-type AlGaInP layers 14 and 24 are subjected to successive selective etching through the stripe mask 32 composed of this silicon oxide film to form mesa-shaped ridges on the heterostructure substrate.

Figure 6G:
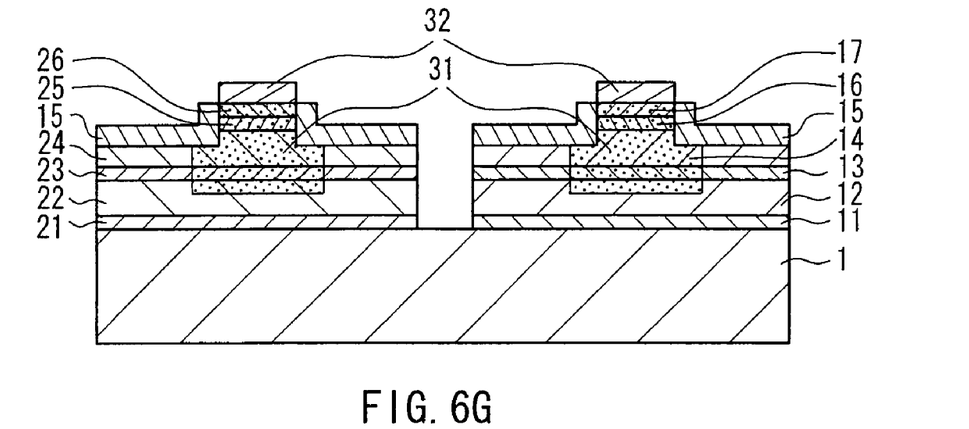

After etching, the substrate 1 is again placed into the MOCVD or MBE reactor and, as shown in FIG. 6G, an n-type AlInP current blocking layer 15 (film thickness: 0.7 μm) is selectively grown using the stripe mask 32.

Figure 6H:
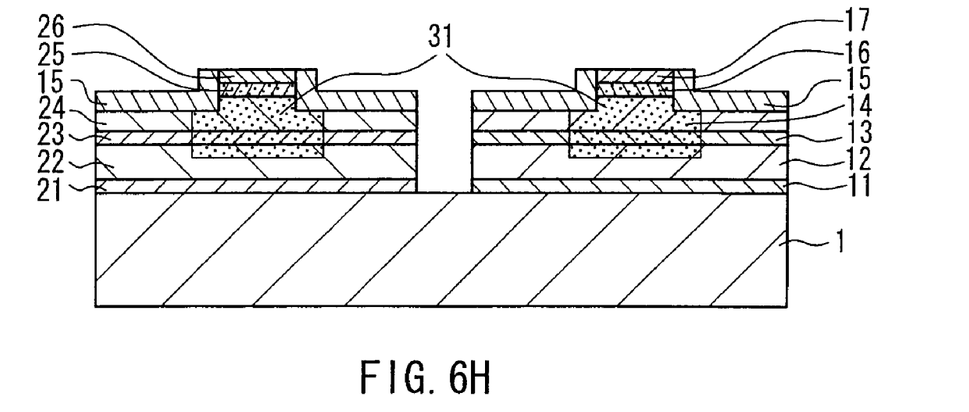

Subsequently, as shown in FIG. 6H, the substrate 1 is taken out of the MOCVD or MBE reactor and the stripe mask 32 is removed using a fluoric acid-based etchant solution.

Furthermore, when the n-type current blocking layer 15 is formed of a dielectric film, after forming the mesa-shaped ridges and using the fluoric acid-based etchant solution to remove the silicon oxide film of which the stripe mask 32 is formed, a dielectric film is formed over the entire surface and patterning is carried out using photolithography so as to open only the p-type GaAs contact layers 17 and 26 at the top of the ridges. It should be noted that, in order to impart a refractive index different from that of the cladding layers 14 and 24, it is desirable to form the dielectric film out of materials composed of SiN, $SiO_2$, $TiO_2$, $Al_2O_3$, hydrogenated amorphous silicon, or layered structures made up of the above.

When the window regions are formed as described above, the red laser 20 and infrared laser 10 are both imparted with identical heat history. In the red laser 20, this not only makes it possible to suppress the diffusion of Zn into the active layer in the portion other than the window region 31, but also makes it possible to decrease the number of element fabrication steps and makes it possible to reduce the cost of element fabrication.

The present invention makes it possible to obtain a two-wavelength semiconductor laser device capable of suppressing the generation of reactive currents flowing through the window regions, having a high COD level, and superior in temperature characteristics, which enable it to operate at elevated temperatures, and is useful for the fabrication of red and infrared semiconductor lasers employed as light sources used for the pickup units of optical disc devices and as light sources necessary for other electronic devices, information processing devices, etc.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A two-wavelength semiconductor laser device having, integrated on a common substrate, a first infrared semiconductor laser and a second red semiconductor laser, each comprising a first conductivity type buffer layer, a first conductivity type cladding layer, a quantum well active layer, and a second conductivity type cladding layer and having a stripe geometry used for carrier injection, with the quantum well active layers in the vicinity of the cavity facets being disordered by impurity diffusion, wherein the first and second conductivity type cladding layers in the first infrared semiconductor laser and the second red semiconductor laser are composed of an AlGaInP material, the active layer of the first infrared semiconductor laser is composed of an AlGaAs material including GaAs and the active layer of the second red semiconductor laser is composed of an AlGaInP material including InGaP, the buffer layer is composed of an AlGaAs material, the impurity is Zn, the cladding layers have a concentration of p-type impurity of $1 \times 10^{18}$ cm$^{-3}$ or higher at a portion that is rendered p-type from n-type by impurity diffusion in the vicinity of the cavity facets, the AlGaAs materials composing the buffer layers of the first infrared semiconductor laser and the second red semiconductor laser satisfy the relationships expressed by the formulas, $X1 \geq 0$, $X2 > 0.37$, and $X2 \geq X1$ where X1 is defined as a compositional ratio of Al in the first infrared semiconductor laser and X2 as a compositional ratio of Al in the second red semiconductor laser, relationships expressed by the following formulas are satisfied, $\lambda 1 > \lambda b1$, $\lambda 2 > \lambda b2$, $\lambda 1 > \lambda 2$, and $E1 < E2$ where $\lambda 1$ is defined as an emission wavelength of an active layer of the first infrared semiconductor laser, $\lambda 2$ as an emission wavelength of the second red semiconductor laser, E1 as a band gap energy of the buffer layer in the first infrared semiconductor laser, E2 as a band gap energy of the buffer layer in the second red semiconductor laser, $\lambda b1$ as a wavelength corresponding to the band gap energy of the buffer layer in the first semiconductor infrared laser, and $\lambda b2$ as a wavelength corresponding to the band gap energy of the buffer layer in the second red semiconductor laser, and a thermal history imparted to the first infrared semiconductor laser is longer than a thermal history imparted to the second red semiconductor laser.

2. The two-wavelength semiconductor laser device according to claim 1, wherein the relationship expressed by the formula, $E1 > E2$, is satisfied.

* * * * *